(12) United States Patent
Hairston

(10) Patent No.: US 10,009,014 B1
(45) Date of Patent: Jun. 26, 2018

(54) INPUT SAMPLING COMPACT SIGNAL AVERAGER

(71) Applicant: BAE Systems Information and Electronic Systems Integration Inc., Nashua, NH (US)

(72) Inventor: Allen W Hairston, Andover, MA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days. days.

(21) Appl. No.: 15/668,119

(22) Filed: Aug. 3, 2017

(51) Int. Cl.
*H03H 19/00* (2006.01)
*G06F 7/70* (2006.01)

(52) U.S. Cl.
CPC ............ *H03H 19/004* (2013.01); *G06F 7/70* (2013.01)

(58) Field of Classification Search
CPC combination set(s) only.
See application file for complete search history.

(56) References Cited

U.S. PATENT DOCUMENTS

| 5,448,189 A | 9/1995 | Lacroix et al. |
| 6,943,564 B2 * | 9/2005 | Yoshida ............... G09G 3/006 324/658 |
| 7,592,987 B2 * | 9/2009 | Chen .................... G09G 3/3233 345/82 |

* cited by examiner

*Primary Examiner* — An Luu
(74) *Attorney, Agent, or Firm* — Maine, Cernota & Rardin

(57) ABSTRACT

A compact signal averaging circuit having an input, a first switch operatively connected to the input, a second switch operatively connected to the first switch, wherein the first switch is coupled to the circuit between the input and the second switch, a first FET having a gate, a source and a drain, wherein the gate is operatively connected to the circuit between the first switch and the second switch, a second FET comprising a gate, a source and a drain, wherein the source is operatively connected to a voltage supply and to the second switch, and an output operatively connected to the first FET drain and the second FET drain.

11 Claims, 6 Drawing Sheets

| Reset Int & Sum 300 | Subframe Integration #1 302 | Split, Sum, Int Reset 304 | Subframe Integration #2 306 | Split, Sum, Int Reset 308 | Subframe Integration #3 310 | Split, Sum, Int Reset 312 |

Figure 3

INPUT SAMPLING COMPACT SIGNAL AVERAGER

STATEMENT OF GOVERNMENT INTEREST

The invention was made with United States Government support under Contract No. HQ0147-14-C-0007, awarded by the US Department of Defense. The United States Government has certain rights in this invention.

FIELD

The disclosure relates to input sampling, and more particularly, to an input sampling compact signal averager useful as an alternative to an input sampling switched capacitor filter circuit.

BACKGROUND

Charge coupled devices (CCDs), complementary metal oxide semiconductor (CMOS) devices, and infrared imagers, which may be referred to generally as Solid State Area Array Imaging Devices (SSAAIDs), are used to capture images received in the form of light. They are currently widely used for both defense and commercial purposes. Some popular uses include digital cameras, scanners, cell phones, and surveillance devices.

SSAAIDs contain pixels arranged in a grid, which is referred to as a Focal Plane Array (FPA). Each pixel of an SSAAID generates and holds an amount of charge proportionate to the intensity of light incident thereon and the length of time that light was allowed to fall on the pixel using an integration circuit.

An integration circuit performs the mathematical operation of integration with respect to time. Said another way, the output voltage of an integration circuit is proportional to the input voltage, integrated over time (Output∝∫Input). In the case of a pixel, the input voltage is generated by the impact of photons on a detector. The charge handling capacity of such a circuit is determined by voltage, integration time, and capacitance of its capacitor(s).

Current SSAAIDs are limited in their ability to provide acceptable images in moderate to low light level conditions as well as in high light level conditions by the dynamic range of the integration circuit of the pixels. In low light level conditions, where there are relatively few incoming photons incident on any given pixel, the signal-to-noise ratio (SNR) of the output is very low, resulting in a grainy/noisy image in dark areas of the image. Moreover, in low SNR situations, other variables can also create non-uniformities in the images where the signal levels are not sufficient to overcome the sensitivity anomalies.

Pixel integration circuits may also become saturated in high light level conditions. When a large amount of light hits a pixel, the integration circuit of that pixel, and even those of nearby pixels due to a phenomenon referred to as "blooming", become saturated, a situation that results in the integration circuit ceasing to be able to capture additional information. Saturation results in washed out images or portions thereof. Although anti-blooming circuits may be used to help reduce the impact of one or a cluster of saturated pixels on others, to increase high light level performance of a given pixel requires increasing the capacity, or well size, of its integration circuit, thereby preventing saturation over a given interval of time.

Prior art FPAs have used shorter integration times to provide better low gain, or high light, performance, but are less sensitive as a result and therefore less able to capture low light level conditions.

Integration circuits may beneficially include compact signal averaging circuits, such as "Compact Signal Averager" (CSA) circuit invented by Mr. Dan Lacroix on which a patent was filed by Loral Infrared & Imaging Systems on May 9, 1994 (see U.S. Pat. No. 5,448,189). The CSA circuit has been used in various applications with circuit configurations as documented in the referenced patent.

Among other applications, the CSA is often used in applications where short-duration, transient noise is a significant issue. One such application is radiation exposure, especially exposure to transient gamma radiation, which causes some subframes to read much higher than others. CSA suppresses that noise since, by design, it only accepts a small portion of the additional high signal. Even for very large prompt pulse events that contaminate the average storage, once the radiation pulse dissipates and one clean subframe is recorded, the circuit can recover quickly.

While CSA excels at short, strong signal suppression, there exists a concern that CSA circuits might suppress valid transient signals. Switched capacitor filter circuits, which do not suppress transients, are more desirable in this case.

Existing CSA circuits, however, are not compatible with switched capacitor filter circuits, which in addition to the benefit described above, also allow for benefits in dynamic range. Furthermore, existing CSA circuits cannot fit on a single pixel with a switched capacitor filter circuit. Existing CSA circuits also have very limited dynamic range.

What is needed, therefore, is a CSA circuit that is compatible with switched capacitor filter circuits, offers improved dynamic range, allows for switching between the two, and can fit on a single pixel with a switched capacitor filter circuit.

SUMMARY

One embodiment of the present disclosure provides a compact signal averaging circuit, the circuit comprising: an input; a first switch operatively connected to the input; a second switch operatively connected to the first switch, wherein the first switch is coupled to the circuit between the input and the second switch; a first FET comprising a gate, a source and a drain, wherein the gate is operatively connected to the circuit between the first switch and the second switch; a second FET comprising a gate, a source and a drain, wherein the source is operatively connected to a voltage supply and to the second switch; and an output operatively connected to the first FET source and the second FET drain.

Another embodiment of the present disclosure provides such a circuit further comprising a switched capacitor filter operatively connected thereto through the input and the output of the circuit.

A further embodiment of the present disclosure provides such a circuit wherein the switched capacitor filter comprises a switched capacitor filter input, a first switched capacitor filter switch, first, second, and third switched capacitor filter capacitors connected in parallel across the first switched capacitor filter switch, a second switched capacitor filter switch operatively connected between the first and second switched capacitor filter capacitors and after the input, a third switched capacitor filter switch operatively connected between the second and third switched capacitor filter capacitors, a fourth switched capacitor filter switch connected after the third switched capacitor filter capacitor and bridging both sides of the parallel first, second, and third switched capacitor filter capacitors, and a switched capacitor filter output, wherein the compact signal averaging circuit input is connected to the switched capacitor filter between the first and second switched capacitor filter capacitors, on the input side of the second switched capacitor filter switch, and wherein the compact signal averaging circuit output is connected to the switched capacitor filter after the third switched capacitor filter capacitor, on the output side of the fourth switched capacitor filter switch.

Yet another embodiment of the present disclosure provides such a circuit wherein the switched capacitor filter input is voltage drain supply.

A yet further embodiment of the present disclosure provides such a circuit wherein the field effect transistors are P-Type field effect transistors.

One embodiment of the present disclosure provides a pixel, the pixel comprising: a compact signal averaging circuit, the circuit comprising: an input; a first switch operatively connected to the input; a second switch operatively connected to the first switch, wherein the first switch is coupled to the circuit between the input and the second switch; a first FET comprising a gate, a source and a drain, wherein the gate is operatively connected to the circuit between the first switch and the second switch; a second FET comprising a gate, a source and a drain, wherein the source is operatively connected to a voltage supply and to the second switch; and an output operatively connected to the first FET source and the second FET drain.

Another embodiment of the present disclosure provides such a pixel further comprising a switched capacitor filter operatively connected thereto through the input and the output of the circuit.

A further embodiment of the present disclosure provides such a pixel wherein the switched capacitor filter comprises a switched capacitor filter input, a first switched capacitor filter switch, first, second, and third switched capacitor filter capacitors connected in parallel across the first switched capacitor filter switch, a second switched capacitor filter switch operatively connected between the first and second switched capacitor filter capacitors and after the input, a third switched capacitor filter switch operatively connected between the second and third switched capacitor filter capacitors, a fourth switched capacitor filter switch connected after the third switched capacitor filter capacitor and bridging both sides of the parallel first, second, and third switched capacitor filter capacitors, and a switched capacitor filter output, wherein the compact signal averaging circuit input is connected to the switched capacitor filter between the first and second switched capacitor filter capacitors, on the input side of the second switched capacitor filter switch, and wherein the compact signal averaging circuit output is connected to the switched capacitor filter after the third switched capacitor filter capacitor, on the output side of the fourth switched capacitor filter switch.

Yet another embodiment of the present disclosure provides such a pixel wherein the switched capacitor filter input is voltage drain supply.

A yet further embodiment of the present disclosure provides such a pixel wherein the field effect transistors are P-Type field effect transistors.

One embodiment of the present disclosure provides a method of operating a compact signal averaging portion of a combined compact signal averager and switched capacitor filter circuit, the method comprising: on a combined compact signal averaging and switched capacitor filter circuit comprising: a compact signal averaging circuit, the circuit comprising: an input; a first switch operatively connected to the input; a second switch operatively connected to the first switch, wherein the first switch is coupled to the circuit between the input and the second switch; a first FET comprising a gate, a source and a drain, wherein the gate is operatively connected to the circuit between the first switch and the second switch; a second FET comprising a gate, a source and a drain, wherein the source is operatively connected to a voltage supply and to the second switch; and an output operatively connected to the first FET source and the second FET drain; and further comprising a switched capacitor filter operatively connected thereto through the input and the output of the circuit. wherein the switched capacitor filter comprises a switched capacitor filter input, a first switched capacitor filter switch, first, second, and third switched capacitor filter capacitors connected in parallel across the first switched capacitor filter switch, a second switched capacitor filter switch operatively connected between the first and second switched capacitor filter capacitors and after the input, a third switched capacitor filter switch operatively connected between the second and third switched capacitor filter capacitors, a fourth switched capacitor filter switch connected after the third switched capacitor filter capacitor and bridging both sides of the parallel first, second, and third switched capacitor filter capacitors, and a switched capacitor filter output, wherein the compact signal averaging circuit input is connected to the switched capacitor filter between the first and second switched capacitor filter capacitors, on the input side of the second switched capacitor filter switch, and wherein the compact signal averaging circuit output is connected to the switched capacitor filter after the third switched capacitor filter capacitor, on the output side of the fourth switched capacitor filter switch; averaging an input signal over a first integration interval by: disabling the first and second switches; enabling the first switch; enabling the gate of the second FET; disabling the gate of the second FET; enabling the first and second switches, thereby ending a sample period; disabling the first switch; and repeating the above steps without enabling or disabling the gate of the second FET when taking subsequent samples.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3 is a flowchart describing switched capacitor filter frame timing, in accordance with embodiments of the present disclosure;

DETAILED DESCRIPTION

In the figures used herein, $V_{SS}$ 122 means Voltage Source Supply, $V_{DD}$ 120 means Voltage Drain Supply, C means capacitor, CSA means Compact Signal Averager, FET means Field Effect Transistor, SCF means Switched Capacitor Filter, subscript int means integration, RS, in subscript or standard font, means reset, SP, in subscript or standard font, means split, SUM, in subscript or standard font, means summing, subscript EN means enable, subscript in refers to the direction of electrical flow, I, in subscript or standard font, is used to refer to current, arrows on FETs are used to indicate the source side of the FET (P-type FETs are shown in the circuit examples provided herein unless otherwise stated, although N-type FETs can be used to create an opposite polarity CSA circuit), and V is used to refer to voltage.

Figure 1:
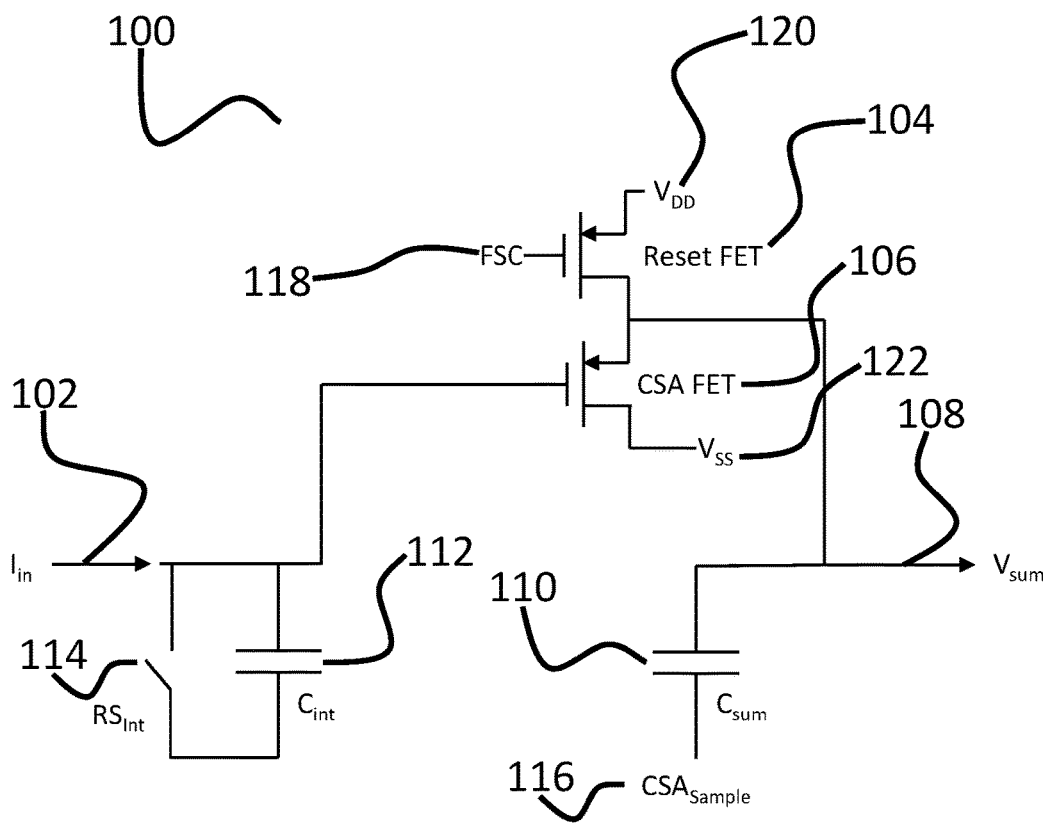
FIG. 1 is a schematic illustrating a prior art compact signal averaging (CSA) circuit.

Prior art Compact Signal Averager (CSA) circuits 100, as described in U.S. Pat. No. 5,448,189 and shown in FIG. 1, are analog signal processing circuits used to suppress unipolar transient effects and to perform signal averaging. Two transistors and one capacitor are generally provided in series to sample and condition an input signal 102. The circuit can function as an analog signal average, suppressing unipolar transient effects and as a peak detector while using a conservative amount of fabrication material and can be operated with low power.

Prior art CSA circuits 100 operate by clocking $CSA_{Sample}$ 116 low to pull the source (CSA output) voltage low and shut off the CSA circuit 100. This means that the source of CSA FET 106, which is connected to $V_{Sum}$ 108, must have a full OFF range that is below the reset level of the integration capacitor 112 and a full ON range above it, reducing the dynamic range.

Now specifically referring to FIG. 1, a Compact Signal Averager (CSA) circuit 100 in accordance with prior art designs is shown. The CSA circuit 100 comprises a current input 102 connected to a reset switch 114, $RS_{Int}$ 114, which is used to reset an integration capacitor, $C_{Int}$ 112. The current input 102 is also connected to the gate of a CSA FET 106, which is a P-type MOSFET. The drain of the CSA FET 106 is connected to $V_{SS}$ 122 and the source is connected to $V_{Sum}$ 108, $C_{Sum}$ 110, and the drain of Reset FET 104, which is a P-type MOSFET. $V_{DD}$ 120 is connected to the source of Reset FET 104. The gate of Reset FET 104 is connected to a First Subframe Current source (FSC) 118.

Figure 2:
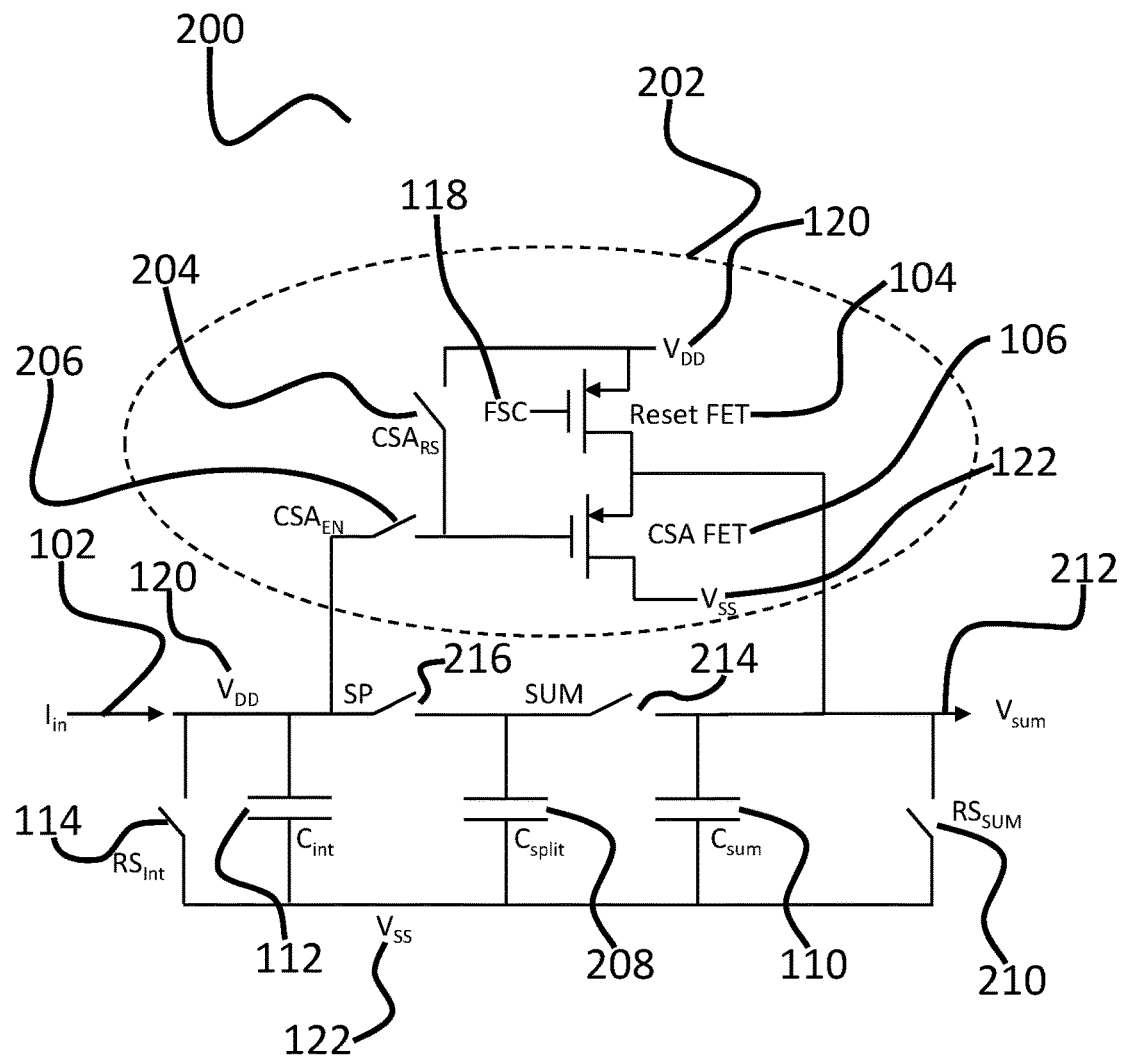
FIG. 2 shows a combined compact signal averaging circuit compatible with switched capacitor filter circuits, configured in accordance with embodiments of the present disclosure.

The present disclosure provides a new input sampling CSA configuration 202, an embodiment of which is shown in FIG. 2. The new CSA configuration 202 maximizes compatibility with another circuit, the switched capacitor filter (SCF) circuit, simplifying a pixel design that includes both circuits 200. Furthermore, embodiments of the present disclosure allow both circuits 200 to fit on a single pixel. Such compatibility is achieved with the addition of only a few Field Effect Transistors (FETs) to the prior art CSA 100. This addition also allows the circuit 200 to perform transient gamma suppression subframe averaging when used in conjunction with switched capacitor based two color IR focal plane arrays. The CSA circuit 202 of embodiments also provides additional dynamic range, as compared to prior art CSA configurations 100.

One difference between the prior art CSA circuit 100 and the CSA circuit of the present disclosure 202 concerns how input data is sampled. Prior art CSA circuits 100 capacitively couple an offset into the output of the CSA input FET 106 to bias the circuit off, effectively sampling it. Embodiments in accordance with the present disclosure switch (204, 206) the CSA input FET 106 gate to a bias ($V_{DD}$ 120) that turns the CSA input FET 106 off and leaves the output floating, resulting in only a small, recoverable shift. This difference provides compatibility with switched capacitor filter circuits and an increased dynamic range. This is due to previous methods keeping the CSA FET 106 input connected to the integration capacitor 112 and shifting $V_{Sum}$ 108 the full circuit range to avoid sampling the input reset, essentially cutting the dynamic range of the circuit in half. The output is shifted using $CSA_{Sample}$ 116, which couples a step voltage into the output, $V_{Sum}$ 108. Embodiments in accordance with the present disclosure switch the input, so the output range is limited only by the offset of the CSA FET 106.

Furthermore, embodiments in accordance with the present disclosure make it simple to create a Readout Integrated Circuit (ROIC) input circuit that can do SCF or CSA subframe averaging. Subframe averaging is most typically used to create a large well capacity with low pass filtering. Subframes can also be used for additional signal processing, such as pulse suppression (or enhancement) with the CSA 202. Since the CSA 202 itself cannot be made to do only low pass filtering, having an SCF option provides the ability to perform low pass filtering in a pixel in addition to CSA filtering and pulse suppression. The new CSA circuit 202 described herein also minimizes the number of FETs as no switch FETs are needed.

Now referring specifically to FIG. 2, a CSA circuit in accordance with embodiments of the present disclosure 202, in combination with a switched capacitor filter, is shown. The portion of the circuit outside of the circle having a dashed line is a switched capacitor filter integrator. A series of subframe integration voltages may be sampled and filtered using the SP 216 and SUM 214 switches. Some components of the circuit are shared by the SCF and CSA 202 circuits. Components used exclusively by the SCF consist of the SP switch 216, SUM switch 214, $C_{split}$ 208, and $RS_{SUM}$ 210.

The new CSA circuit 202 shown in combination with a switched capacitor filter circuit, forms a combined CSA/switched capacitor filter circuit 200. The combined circuit comprises a current input 102 connected to an integration reset switch 114, $RS_{INT}$ 114 and an integration capacitor 112, $C_{Int}$ 112, a CSA Enable switch 206, $CS_{EN}$ 206, and a split switch 216, SP 216. SP 216, when enabled, connects a split capacitor 208, $C_{Split}$ 208, and a summing switch 214, SUM 214, to the circuit. Likewise, $CSA_{EN}$ 206 connects the gate of a CSA FET 106 and a CSA reset switch 204, $CSA_{RS}$ 204, to the circuit. CSA FET 106, in embodiments, is a P-type MOSFET whose drain is connected to $V_{SS}$ 122 and whose source is connected to $V_{Sum}$ 212. $CSA_{RS}$ 204, when closed, connects to $V_{DD}$ 120 and the source of a reset FET 104. The gate of the reset FET 104 connects to FSC 118 while the drain connects to the source of CSA FET 106 and $V_{Sum}$ 212. SUM 214, when closed, connects a summing capacitor 110, $C_{Sum}$ 110, to the circuit and also connects to $V_{Sum}$ 212. Lastly, a summing capacitor reset switch 210, $RS_{Sum}$ 210, connects $V_{SS}$ 122 to $V_{DD}$ 120 across $C_{Sum}$ 110, allowing it to be reset.

The circuit encircled by the dashed line 202 is a new configuration of a CSA circuit 202, in accordance with embodiments of the present disclosure. This new CSA circuit 202 allows either regular switched capacitor filter operation (CSA disabled) or CSA operation (CSA enabled). To disable the new CSA 202, $CSA_{EN}$ 206 and $CSA_{RS}$ 204 must be turned off while $CSA_{RS}$ 204 must be turned on. When the new CSA 202 is disabled in this way, its output is open (input and output are floating for no effect on Switched Capacitor Filter (SCF) operation).

To enable the new CSA 202, which also serves as a subframe averager that samples and filters subframe outputs, $CSA_{EN}$ 206 must be turned on & $CSA_{RS}$ 204 must be turned off to sample the end of a subframe. A first sample must also have the reset FET 104 turned on as current source (otherwise it should be turned off). When the new CSA 202 is used, the SUM switch 214 must stay off (open) and there is no need for $RS_{SUM}$ 210.

CSA circuits in accordance with embodiments of the present disclosure 202 work by switching the input gate of CSA FET 106 to the integration capacitor 112, $C_{int}$ 112, or pulling it high. In embodiments, a current source is used to pull it high so that it can start pulling high before disconnecting from the integration capacitor 112, $C_{int}$ 112, to avoid any low transients, which would otherwise be stored by the CSA. Since $CSA_{RS}$ 204 is implemented, in embodiments, as a PFET, it can be operated as a pull up current source as well as a switch. The range of CSA circuits constructed in accordance with embodiments of the present disclosure is then only limited by the P threshold of the CSA FET 106.

When the CSA is not used, $CSA_{EN}$ 206 is used to disconnect the new CSA 202 from $C_{Int}$ 112. $CSA_{RS}$ 204 is used to pull up the CSA input, shutting off the CSA FET 106. $CSA_{RS}$ 204 is left off. This results in only one relatively small diffusion capacitance at input and output from the new CSA circuit 202 when not used.

A SUM 214 SCF clock may be disabled (open circuit) for CSA operation. $RS_{Sum}$ 210 is also not used (open circuit), as the new CSA circuit 202 has its own reset (Reset FET 104 activated by FSC 118) which, in embodiments, resets the CSA output, $V_{Sum}$ 212, to a higher voltage, not down to $V_{SS}$ 122 as $RS_{Sum}$ 210 does.

In embodiments, a split capacitor 208, $C_{Split}$ 208, is used to provide CSA integration capacitance.

While the prior art CSA circuit 100 shown in FIG. 1 is a slightly simpler design for a stand-alone CSA circuit, it requires a special clock signal, $CSA_{Sample}$ 116, which has a special mid-scale bias level on it when not sampling. Two additional switches are required in the new design, although a previously-used CSA_Sample signal that goes from $V_{DD}$ 120 to mid-scale level is no longer needed in the new design. In the new design, the mid-scale level has to be low enough to keep the CSA FET 106 off when the integration capacitor 112 ($C_{Int}$ 112) is reset to $V_{SS}$ 122. In this new design, the mid-scale must also be high enough to prevent a stored signal from being driven so low that it leaks away when off.

The operation of the prior art CSA 100 is similar to the new CSA 202 disclosed herein, except that, in the embodiments disclosed herein, $CSA_{Sample}$ 116 going low performs sampling by capacitive coupling to the output instead of $CSA_{RS}$ 204 and $CSA_{EN}$ 206 switching at input. Both methods of sampling bias the CSA FET 106 off to stop sampling and bias the CSA FET 106 on to start sampling. Both designs rely on the FSC 118 going below the PFET threshold to turn on as a current source during a first sample.

To perform subframe averaging, the total integration time in one frame is divided into a number of sub-frame integration times, the output of which is combined with signal processing to create the frame output for each pixel. The Switched Capacitor Filter (SCF) circuit and the Compact Signal Averager (CSA) are both circuits for signal processing subframe integrations.

The SCF circuit is a low pass filter, which works well for a wide range of subframe averages, including single subframes. The Compact Signal Averager circuit performs low pass filtering, but also performs other types of signal processing, depending on the relationship between the current subframe output level and the current processed level, such as a low pick. This other processing can be useful for reducing noise due to transient gamma radiation.

Figure 4:
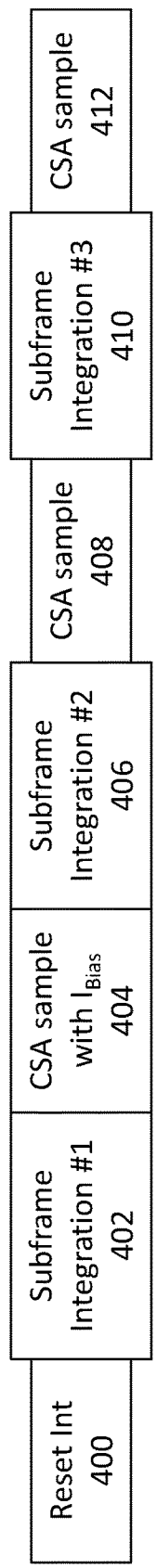
FIG. 4 is a flowchart describing compact signal average frame timing, in accordance with embodiments of the present disclosure.

FIG. 3 shows frame timing for using an SCF filter circuit while FIG. 4 shows frame timing using the CSA circuit 202. In both circuits, the integration capacitor 112 is reset prior to each subframe integration ("Reset Int"). For an SCF circuit, the sum capacitor 110 is also reset before first sum ("Reset Int & Sum"). For a CSA circuit 202, in embodiments, the first subframe sample has bias current to allow it to set its output to a first sample voltage ("CSA sample with $I_{Bias}$"). For a CSA circuit 202, subsequent samples have no current bias and output settles based on stored charge on an output capacitor ("CSA sample"). At the end of these sequences, the output $V_{Sum}$ 212 is ready to be read out.

Now referring to FIG. 3 specifically, the steps for performing subframe averaging using the switched capacitor filter portion of the new combined CSA/SCF circuit 200 in accordance with embodiments of the present disclosure are shown. The first step is to reset the integration capacitor 112 and sum capacitor 110 300. Following the reset, a first subframe integration is performed 302. After the first subframe integration, the split capacitor 208, sum capacitor 110, and integration capacitor 112 are reset 304/308/312 between second, third, and subsequent integrations 306/310, as desired.

Now referring to FIG. 4 specifically, the steps for performing subframe averaging using the compact signal averaging portion 202 of the new combined CSA/SCF circuit 200 in accordance with embodiments of the present disclosure are shown. The first step is to reset the integration capacitor 112 400. The next step is to perform integration of the first subframe 402. Following first subframe integration, a CSA sample with $I_{Bias}$ is taken 404. The sample with bias current resets the CSA output to a level corresponding to the first subframe output. Following first subframe integration and sampling, additional integrations are performed 406/410 with CSA samples without $I_{Bias}$ taken between integrations 408/412.

Figure 5:
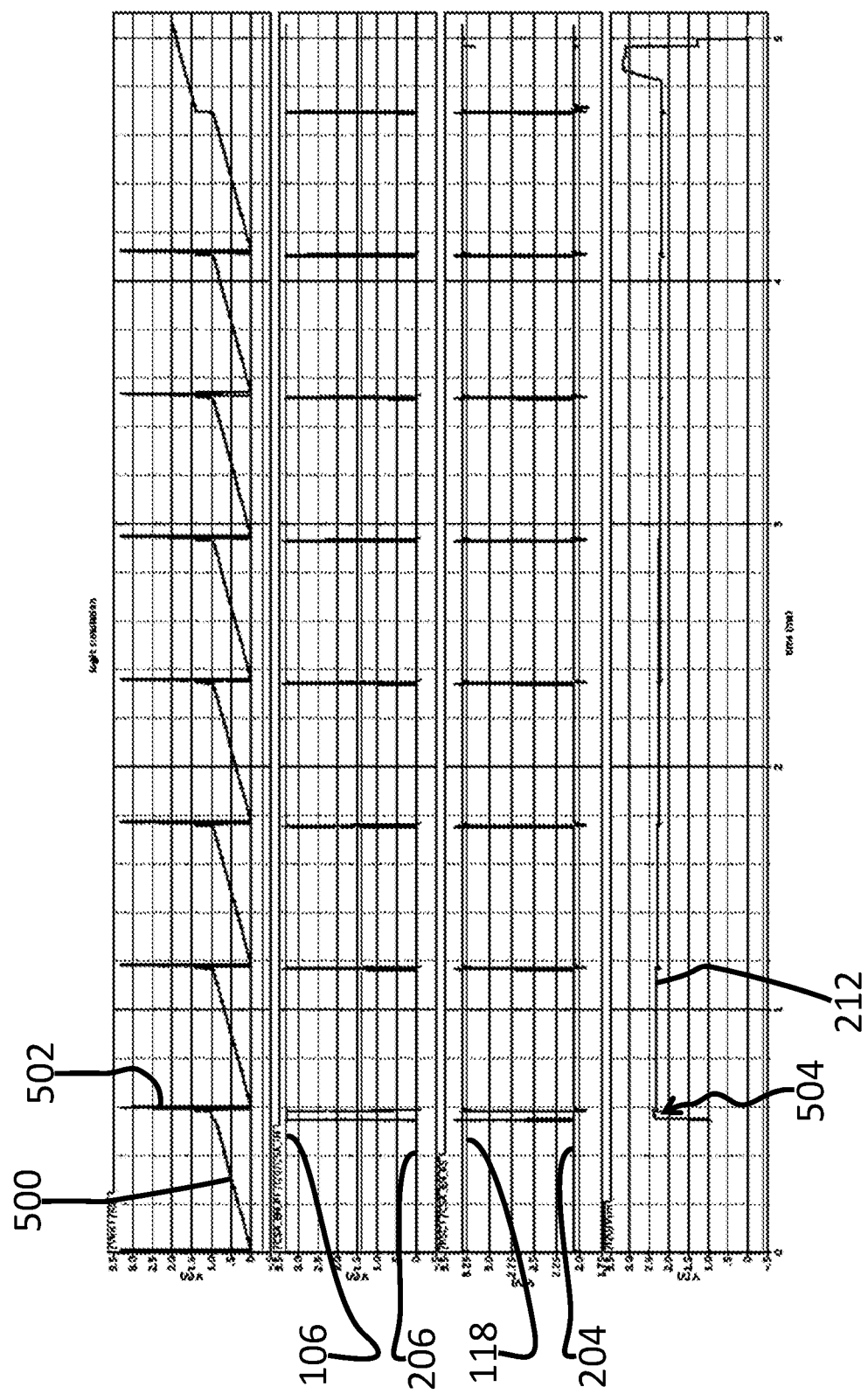
FIG. 5 is a chart describing the logic and frame timing used by compact signal averaging circuits over eight subframes, in accordance with embodiments of the present disclosure.

Now referring to FIG. 5, a chart describing the logic and frame timing used by compact signal averaging circuits 202 in accordance with embodiments of the present disclosure over eight sub-frames is shown. The first graph from the top has two signals plotted on it. The ramp waveform is the integration voltage, $V_{int}$ 500. It integrates up and resets each subframe. The high pulse waveform is the integration reset clock $RS_I$ 502, going high to reset the integration capacitor 112.

The second graph also shows two waveforms. The input of the CSA circuit 106 is shown as a high signal that periodically goes low. The $CSA_{EN}$ 206 signal controls this and is a low signal that goes high at the same time as the CSA FET 106 input goes low.

The third graph has two more signals and is on a different scale than the others. The low level on this graph is a voltage that causes the reset FET 104 to become a current source. The high signal is FSC 118, which goes low to turn it on as a current source during the first subframe at the same time as the $CSA_{RS}$ 204 goes high to turn CSA FET 106 off. This performs the first sample. In subsequent samples, when $CSA_{RS}$ 204 goes high to enable sampling, FSC 118 stays high and reset FET 104 stays off (open).

The final lowest graph shows the CSA output, $V_{Sum}$ 212. Point 504 marks the point at which a CSA first sample sets the CSA output voltage to the subframe. CSA output voltage rises up on the first sample. While, in actual use it stays relatively between samples, due to artifacts caused by the simulation having difficulty modeling off currents as low as they actually are during cryogenic operation, which is used in embodiments, the simulated graph drifts slightly (i.e. leakage in model due to accuracy setting (Rd of 1E12) of this simulation). At each subsequent sample time, the output 212 drops slightly. CSA output subframe averaging appears as gradual settling in steps at each sample.

Figure 6:
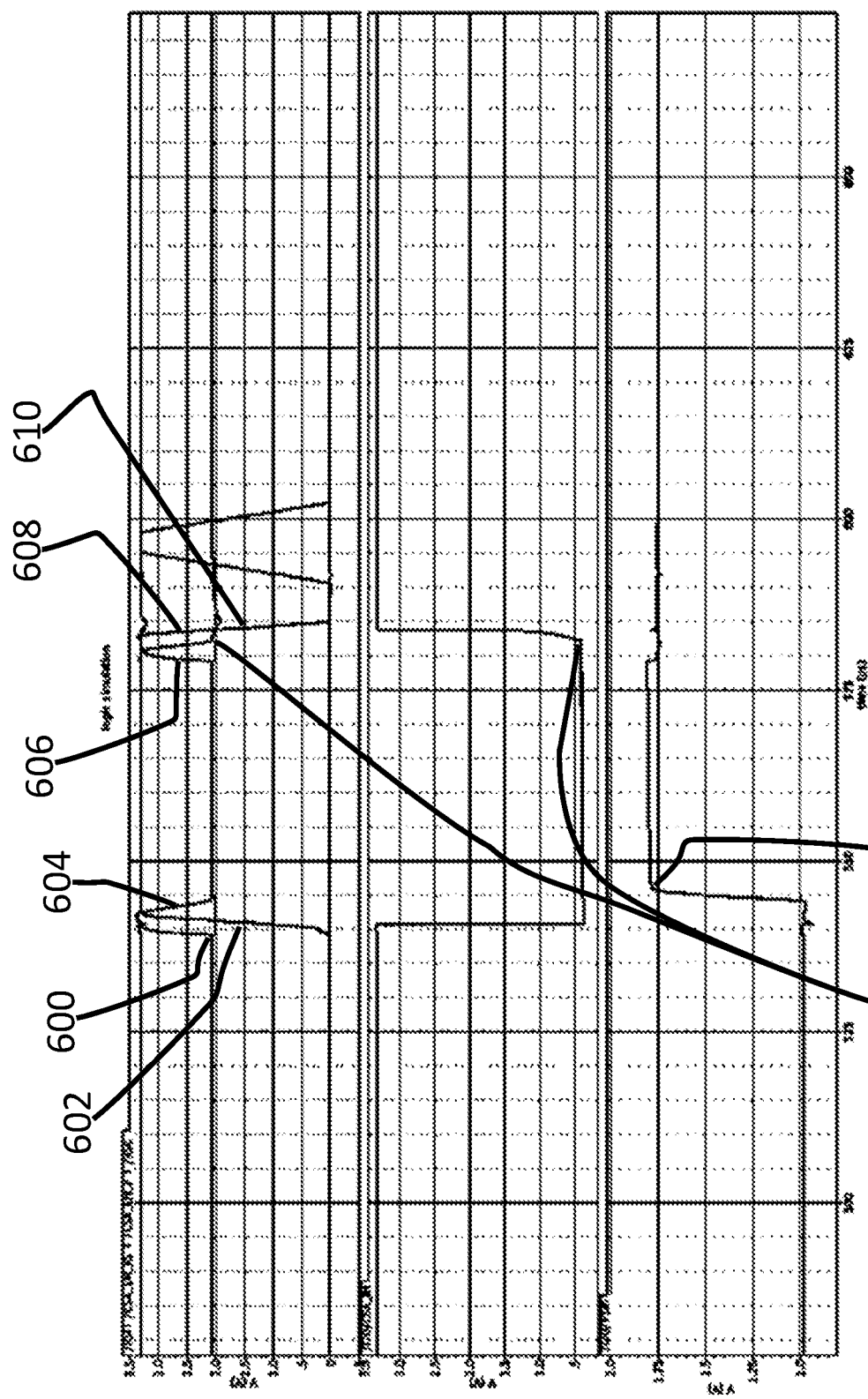
FIG. 6 is a chart describing a simulation of a single compact signal averager sample showing the timing of clocks for a first sample, in accordance with embodiments of the present disclosure.

Now referring to FIG. 6, a chart describing a simulation of a single compact signal averager sample showing the timing of clocks for a first sample, in accordance with embodiments of the present disclosure, is shown. FIG. 6 is the same simulation as FIG. 5 with the timing expanded for the first sample to show the correct sequence. However the traces are arranged differently in order to compare timing.

In FIG. 6, point 600 corresponds with $CSA_{RS}$ 204 being disabled. Point 602 corresponds with $CSA_{EN}$ 206 being enabled. Point 604 corresponds to FSC 118 being enabled as a current source bias, thus enabling reset FET 104 as a current source. Point 606 corresponds to FSC 118 being disabled, thus disabling reset FET 104. Point 608 corresponds to enabling $CSA_{RS}$ 204, thereby ending a sample. Lastly, point 610 corresponds to disabling of $CSA_{EN}$ 206. Subsequent sample timing is identical, except that FSC 118 is not used. Point 612 identifies CSA FET 106 input voltage. If the timing is correct, this voltage should not drop more than a few millivolts at the conclusion of a sampling period, as shown. Point 614 identifies CSA FET 106 output voltage, $V_{Sum}$ 212. The first sample taken sets the output to input added to offset, as discussed above.

Embodiments of the present disclosure could be used to suppress bright flashes from a scene. An opposite polarity version of a circuit in accordance with embodiments of the present disclosure could be used to sample bright flashes from a scene, for example to optimize detection of missile launches or muzzle flashes.

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. A compact signal averaging circuit, the circuit comprising:
   an input;
   a first switch operatively connected to said input;
   a second switch operatively connected to said first switch, wherein said first switch is coupled to said circuit between said input and said second switch;
   a first FET comprising a gate, a source and a drain, wherein said gate is operatively connected to said circuit between said first switch and said second switch;
   a second FET comprising a gate, a source and a drain, wherein said source is operatively connected to a voltage supply and to said second switch; and
   an output operatively connected to said first FET source and said second FET drain.

2. The circuit of claim 1 further comprising a switched capacitor filter operatively connected thereto through said input and said output of said circuit.

3. The circuit of claim 2 wherein said switched capacitor filter comprises a switched capacitor filter input, a first switched capacitor filter switch, first, second, and third switched capacitor filter capacitors connected in parallel across said first switched capacitor filter switch, a second switched capacitor filter switch operatively connected between said first and second switched capacitor filter capacitors and after said input, a third switched capacitor filter switch operatively connected between said second and third switched capacitor filter capacitors, a fourth switched capacitor filter switch connected after said third switched capacitor filter capacitor and bridging both sides of said parallel first, second, and third switched capacitor filter capacitors, and a switched capacitor filter output, wherein said compact signal averaging circuit input is connected to said switched capacitor filter between said first and second switched capacitor filter capacitors, on the input side of said second switched capacitor filter switch, and wherein said compact signal averaging circuit output is connected to said switched capacitor filter after said third switched capacitor filter capacitor, on the output side of said fourth switched capacitor filter switch.

4. The circuit of claim 2 wherein said switched capacitor filter input is voltage drain supply.

5. The circuit of claim 1 wherein said field effect transistors are P-Type field effect transistors.

6. A pixel, the pixel comprising:
   a compact signal averaging circuit, the circuit comprising:
   an input;
   a first switch operatively connected to said input;
   a second switch operatively connected to said first switch, wherein said first switch is coupled to said circuit between said input and said second switch;
   a first FET comprising a gate, a source and a drain, wherein said gate is operatively connected to said circuit between said first switch and said second switch;
   a second FET comprising a gate, a source and a drain, wherein said source is operatively connected to a voltage supply and to said second switch; and
   an output operatively connected to said first FET source and said second FET drain.

7. The circuit of claim 6 further comprising a switched capacitor filter operatively connected thereto through said input and said output of said circuit.

8. The circuit of claim 7 wherein said switched capacitor filter comprises a switched capacitor filter input, a first switched capacitor filter switch, first, second, and third switched capacitor filter capacitors connected in parallel across said first switched capacitor filter switch, a second switched capacitor filter switch operatively connected between said first and second switched capacitor filter capacitors and after said input, a third switched capacitor filter switch operatively connected between said second and third switched capacitor filter capacitors, a fourth switched capacitor filter switch connected after said third switched capacitor filter capacitor and bridging both sides of said parallel first, second, and third switched capacitor filter capacitors, and a switched capacitor filter output, wherein said compact signal averaging circuit input is connected to said switched capacitor filter between said first and second switched capacitor filter capacitors, on the input side of said second switched capacitor filter switch, and wherein said compact signal averaging circuit output is connected to said switched capacitor filter after said third switched capacitor filter capacitor, on the output side of said fourth switched capacitor filter switch.

9. The circuit of claim 7 wherein said switched capacitor filter input is voltage drain supply.

10. The circuit of claim 6 wherein said field effect transistors are P-Type field effect transistors.

11. A method of operating a compact signal averaging portion of a combined compact signal averager and switched capacitor filter circuit, the method comprising:
   on a combined compact signal averaging and switched capacitor filter circuit comprising:
   a compact signal averaging circuit, the circuit comprising:
   an input;
   a first switch operatively connected to said input;
   a second switch operatively connected to said first switch, wherein said first switch is coupled to said circuit between said input and said second switch;
   a first FET comprising a gate, a source and a drain, wherein said gate is operatively connected to said circuit between said first switch and said second switch;
   a second FET comprising a gate, a source and a drain, wherein said source is operatively connected to a voltage supply and to said second switch; and
   an output operatively connected to said first FET source and said second FET drain; and
   further comprising a switched capacitor filter operatively connected thereto through said input and said output of said circuit, wherein said switched capacitor filter comprises a switched capacitor filter input, a first switched capacitor filter switch, first, second, and third switched capacitor filter capacitors connected in parallel across said first switched capacitor filter switch, a second switched capacitor filter switch operatively connected between said first and second switched capacitor filter capacitors and after said input, a third switched capacitor filter switch operatively connected between said second and third switched capacitor filter capacitors, a fourth switched capacitor filter switch connected after said third switched capacitor filter capacitor and bridging both sides of said parallel first, second, and third switched capacitor filter capacitors, and a switched capacitor filter output, wherein said compact signal averaging circuit input is connected to said switched capacitor filter between said first and second switched capacitor filter capacitors, on the input side of said second switched capacitor filter switch, and wherein said compact signal averaging circuit output is connected to said switched capacitor filter after said third switched capacitor filter capacitor, on the output side of said fourth switched capacitor filter switch;
   averaging an input signal over a first integration interval by:
   disabling said first and second switches;
   enabling said first switch;
   enabling the gate of said second FET;
   disabling the gate of said second FET;
   enabling said first and second switches, thereby ending a sample period;
   disabling said first switch;
   and repeating the above steps without enabling or disabling the gate of said second FET when taking subsequent samples.

* * * * *